(12) United States Patent
Yi et al.

(10) Patent No.: US 9,012,265 B2
(45) Date of Patent: Apr. 21, 2015

(54) MAGNET ASSISTED ALIGNMENT METHOD FOR WAFER BONDING AND WAFER LEVEL CHIP SCALE PACKAGING

(76) Inventors: Ge Yi, San Ramon, CA (US); Zongrong Liu, Pleasanton, CA (US); Yunjun Tang, Pleasanton, CA (US); Shaoping Li, San Ramon, CA (US)

( * ) Notice: Subject to any disclaimer, the term of this patent is extended or adjusted under 35 U.S.C. 154(b) by 645 days.

(21) Appl. No.: 13/429,440

(22) Filed: Mar. 26, 2012

(65) Prior Publication Data

US 2013/0252375 A1     Sep. 26, 2013

(51) Int. Cl.
    *H01L 21/68*          (2006.01)
    *H01L 23/00*          (2006.01)

(52) U.S. Cl.
CPC ................. *H01L 24/83* (2013.01); *H01L 24/94* (2013.01); *H01L 24/97* (2013.01); *H01L 2924/01322* (2013.01); *H01L 2224/05547* (2013.01); *H01L 2224/03614* (2013.01); *H01L 2224/03826* (2013.01); *H01L 2224/80801* (2013.01); *H01L 24/03* (2013.01); *H01L 24/05* (2013.01); *H01L 24/08* (2013.01); *H01L 24/11* (2013.01); *H01L 24/13* (2013.01); *H01L 24/16* (2013.01); *H01L 24/80* (2013.01); *H01L 24/81* (2013.01); *H01L 2224/0345* (2013.01); *H01L 2224/03452* (2013.01); *H01L 2224/03462* (2013.01); *H01L 2224/0362* (2013.01); *H01L 2224/05009* (2013.01); *H01L 2224/05073* (2013.01); *H01L 2224/05082* (2013.01); *H01L 2224/05083* (2013.01); *H01L 2224/05084* (2013.01); *H01L 2224/05124* (2013.01); *H01L 2224/05144* (2013.01); *H01L 2224/05147* (2013.01); *H01L 2224/05155* (2013.01); *H01L 2224/05157* (2013.01); *H01L 2224/05578* (2013.01); *H01L 2224/056* (2013.01); *H01L 2224/05624* (2013.01); *H01L 2224/05644* (2013.01); *H01L 2224/05647* (2013.01); *H01L 2224/05655* (2013.01); *H01L 2224/05657* (2013.01); *H01L 2224/08146* (2013.01); *H01L 2224/1145* (2013.01); *H01L 2224/11452* (2013.01); *H01L 2224/11462* (2013.01);
(Continued)

(58) Field of Classification Search
CPC .............................. H01L 21/68; H01L 23/544
See application file for complete search history.

(56) References Cited

U.S. PATENT DOCUMENTS 3,868,759 A * 3/1975 Hartleroad et al. ............. 29/464
6,049,974 A * 4/2000 Asanasavest ................... 29/832
(Continued)

*Primary Examiner* — John C Ingham

(57) ABSTRACT

A high-precision alignment method with high throughput is proposed, which can be used for wafer-to-wafer, chip-to-wafer or chip-to-chip bonding. The scheme implements pairing patterned magnets predetermined designed and made using wafer level process on two components (wafer or chip). The magnetization in patterned magnet can be set at predetermined configuration before bonding starts. When, the two components are bought to close proximity after a coarse alignment, the magnetic force will bring the magnet pairs together and aligned the patterned magnet on one component with its mirrored or complimentary patterned magnets on the other component to minimize the overall the magnetic energy of the pairing magnet. A few patterned magnet structures and materials, with their unique merits are proposed as examples for magnet pair for the self-alignment purpose. This method enables solid contact at the bonding interface via patterned magnets under the magnetic force, which avoid the wafer drafting due to the formation of the liquid phases.

19 Claims, 12 Drawing Sheets

(52) U.S. Cl.
CPC .......... *H01L 2224/1162* (2013.01); *H01L 2224/13022* (2013.01); *H01L 2224/13025* (2013.01); *H01L 2224/131* (2013.01); *H01L 2224/16146* (2013.01); *H01L 2224/80121* (2013.01); *H01L 2224/80143* (2013.01); *H01L 2224/81121* (2013.01); *H01L 2224/81143* (2013.01); *H01L 2224/81801* (2013.01); *H01L 2224/94* (2013.01); *H01L 2224/97* (2013.01); *H01L 2224/05576* (2013.01); *H01L 2224/03612* (2013.01); *H01L 2224/03827* (2013.01); *H01L 2224/80169* (2013.01); *H01L 2224/81169* (2013.01); *H01L 2924/1461* (2013.01)

(56) References Cited

U.S. PATENT DOCUMENTS

| | | | | |
|---|---|---|---|---|
| 6,142,361 | A * | 11/2000 | Downes et al. | 228/173.1 |
| 7,994,608 | B2 * | 8/2011 | Tan et al. | 257/531 |
| 2006/0234405 | A1 * | 10/2006 | Best | 438/15 |

* cited by examiner

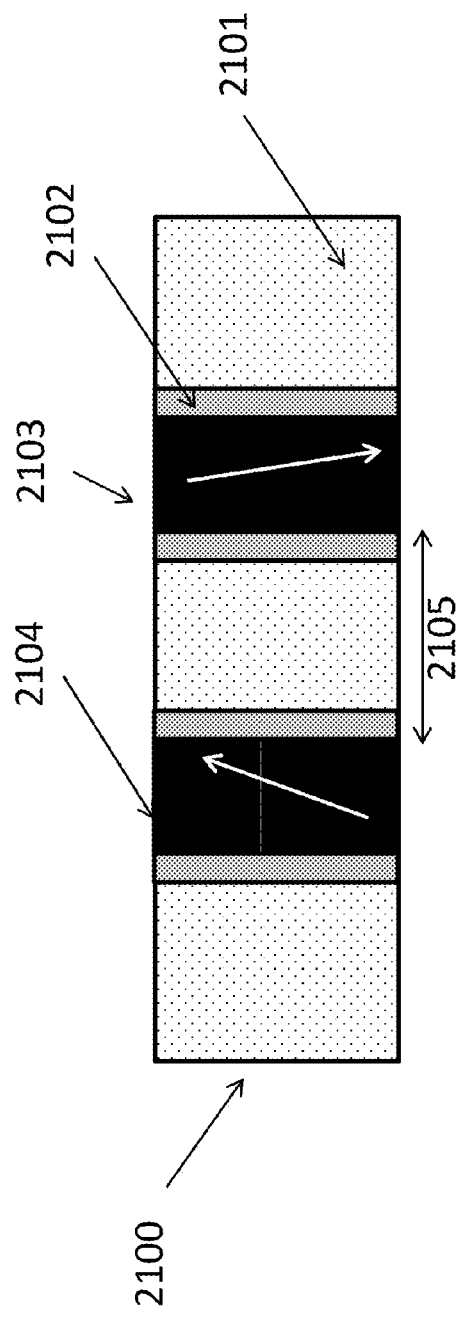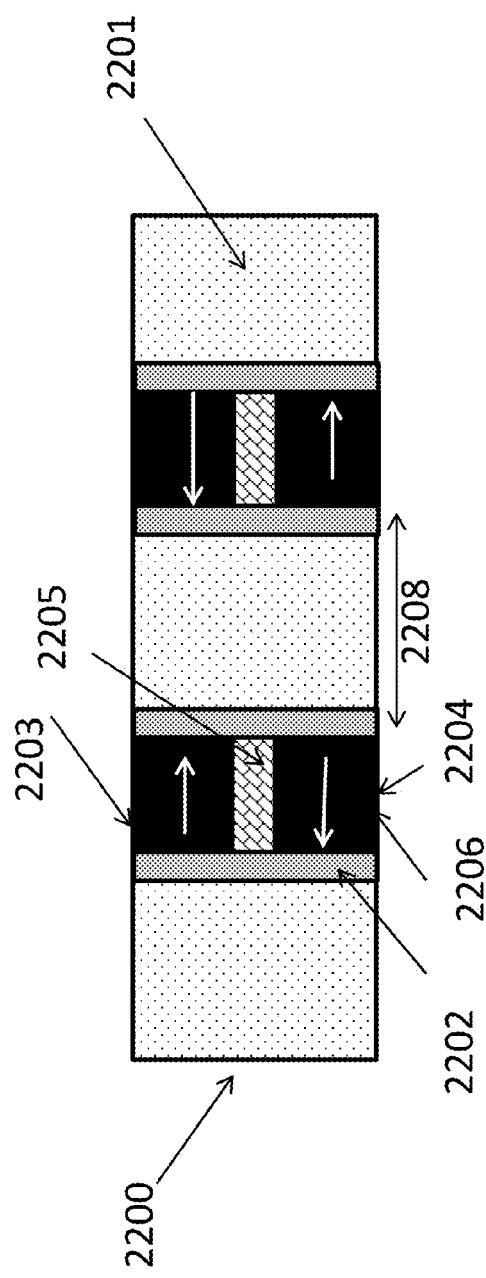
FIG.2A
FIG.2B

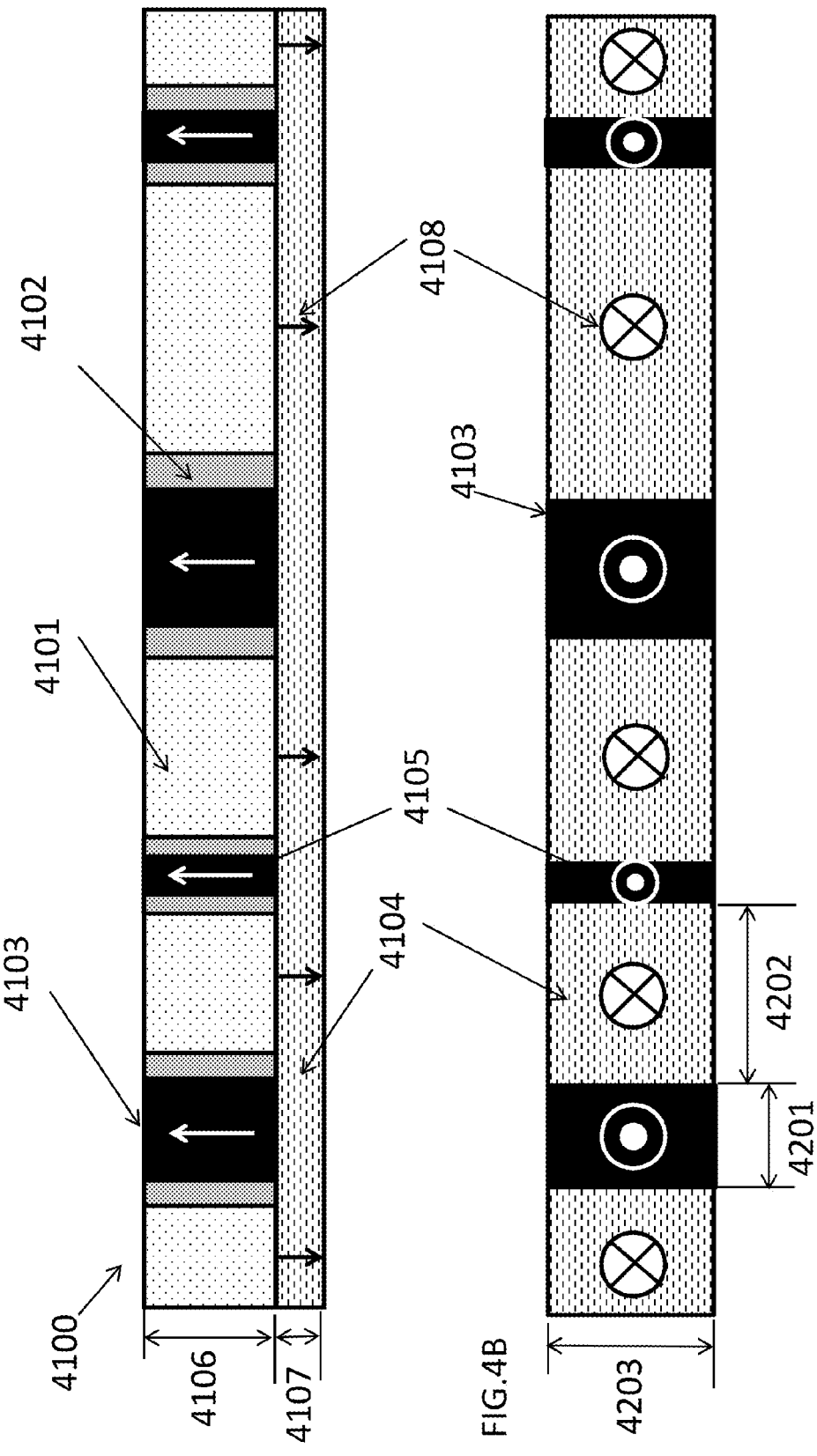

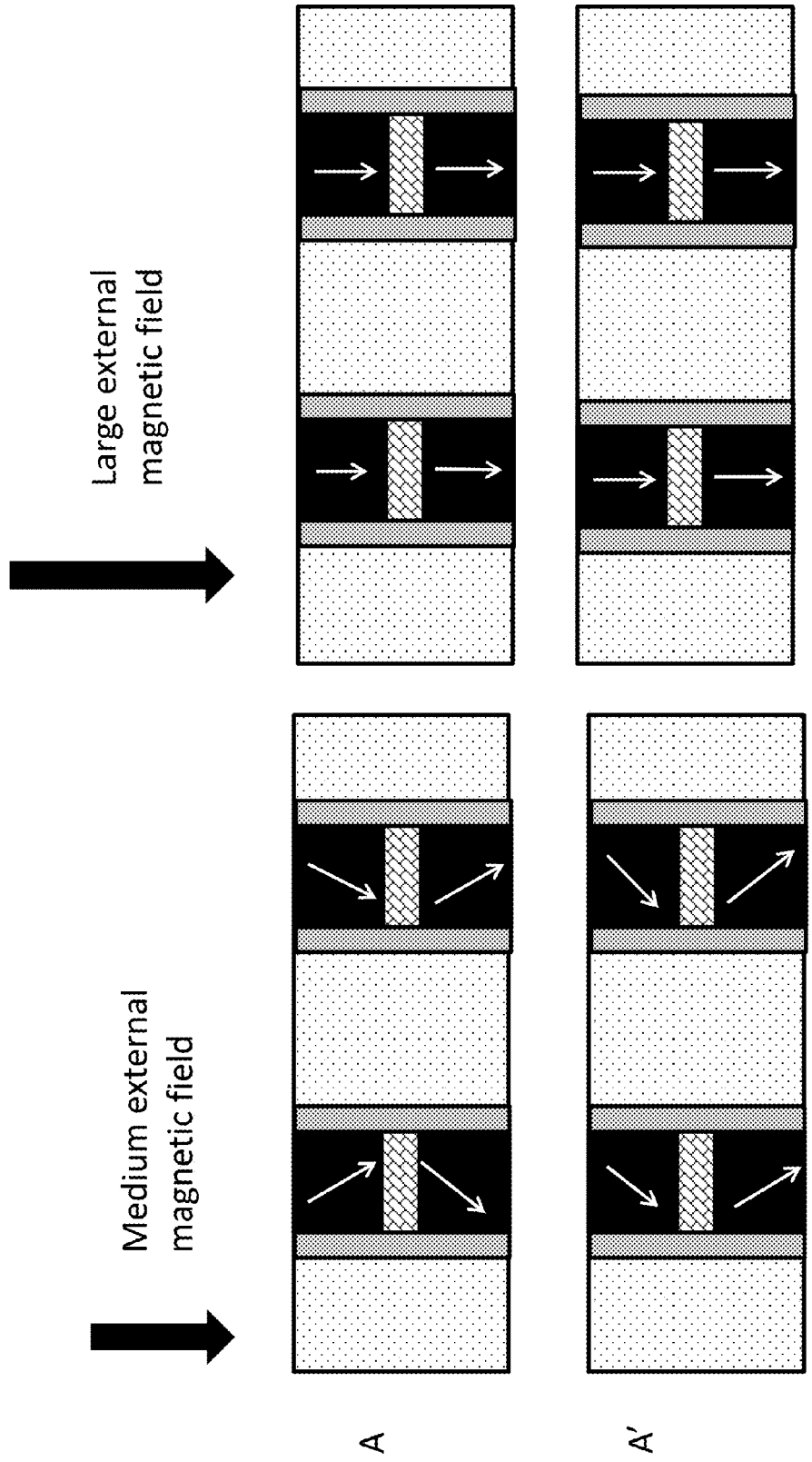

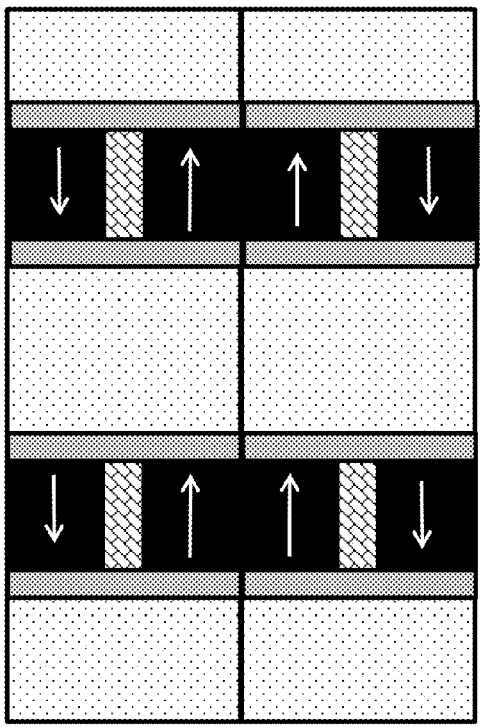
FIG.6F
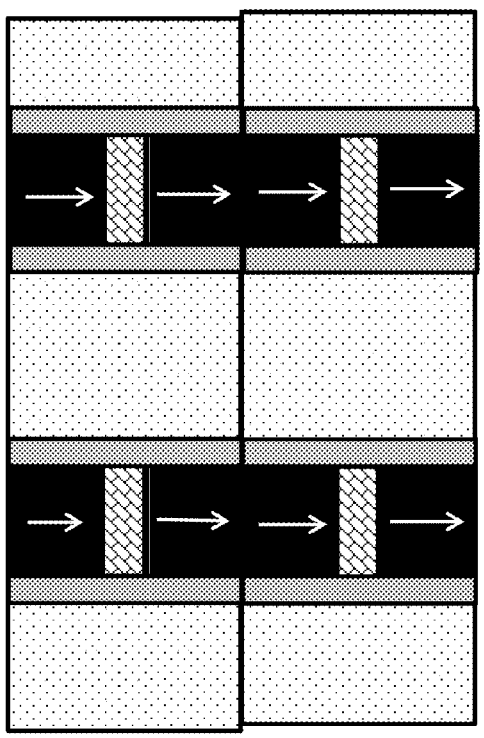
FIG.6E

MAGNET ASSISTED ALIGNMENT METHOD FOR WAFER BONDING AND WAFER LEVEL CHIP SCALE PACKAGING

REFERENCE CITED-US PATENT DOCUMENTS

FIELD OF INVENTION

The invention is related to precision alignment methodology for wafer-to-wafer bonding or chip-to-wafer bonding, more specifically the utilization of predetermined patterned magnet pairs to facilitate precision wafer-to-wafer or chip-to-wafer alignment for bonding. In order to take the advantage of self-alignment and attractive force between the north pole (N-pole) and south pole (S-pole), specially designed magnets, which can be brought for pairing (or matching), are fabricated via wafer level processes, respectively, on individual bonding wafer or chip. Once the magnetization of the magnets is aligned, while the two wafers or chip are brought to close proximity, the force between the pairing magnets will automatically align the wafers or chip-to-wafer in order to minimize the overall magnetic energy. Specially designed magnets can enable the external field activation or deactivation of the magnet pairing and control the force between the magnets via the degree of magnetization alignment. Alignment accuracy in a sub-micron scale can be achieved via magnet patterns design.

BACKGROUND ART

Precision alignment accuracy in a sub-micron scale, together with high unit-per-hour (UPH), has always been a huge challenge in the electronics and semiconductor industry in the past a few decades. On the other hand, the demand for an alignment metrology with both high-precision and high UPH is significantly increased due to applications in 3-D integration, optical packaging, advanced wafer-level packaging, microfluidics, MEMS, and NEMS.

Either an optical microscopy, or an IR transmission microscopy, or an intersubstrate microscopy is used in conventional alignment methods to monitor the alignment marks on both wafers or chips during the alignment process within an aligner and/or a bonder. In order to match the alignment marks on both wafers or chip-and-wafer, one of the two components, usually the one held by the bond head, can be adjusted in x, y, and z directions and rotated in theta. Once the alignment markers are aligned, the microscopy is removed, the component on the bond head is then brought down to the wafer on the bottom chuck for bonding. Both wafers (or chip and wafer) are not in contact during the alignment process and consequently there is no force in between the two components to hold the alignment accuracy, which can be dramatically reduced during moving the component on the bond head down to contact the wafer on the chuck and then bonding process.

The present invention is distinguished from conventional alignment methods in that the two components (either wafer to wafer or chip to wafer) are in contact during the active alignment process assisted by magnetic force between complimentary pairing patterned magnets on two components in an applied magnetic field. Once the alignment process is done, both components are locked in-situ by the magnetic force without further alignment accuracy loss. A novel bonding method is then used to obtain vertical interconnects between the two components without losing the alignment accuracy, which is described in another invention by the authors. In the case of chip-to-wafer bonding, all chips can be placed on the wafer with loose alignment accuracy with high throughput. The force between pairing patterned magnets will push for the high precision alignment via self-alignment process. At some particular cases, high-precision alignment can be done between the chips and the wafer at the same time via external activation of self-alignment between the patterned magnets by turning on the external magnetic field. Thus a high-precision alignment method with high UPH is achieved. Since the magnetic force will hold the alignment together between the chip and the wafer, the bonding can be done at once for all the chips after the chips have all been aligned. By doing so, we can also cut down the UPH time for chip-to-wafer bonding.

SUMMARY OF THE INVENTION

In this invention, we propose a general alignment scheme capable of sub-micron accuracy with high UPH output, which can be used on wafer-to-wafer and chip-to-wafer bonding. The scheme implements specially designed pairing patterned magnets made using wafer level process. The magnetization within the magnets can be manipulated during wafer bonding to activate or/and tune the magnetic force between the magnets on the two wafers or chip-to-wafer during bonding process by external magnetic field. To assist the alignment, a complimentary arrangement of pairing patterned magnets is made on two components (wafers or chips) for bonding. When the two components are brought to close proximity and the magnetic force will bring the pairing magnets together to facilitate self-alignment for minimizing the overall the magnetic energy of the pairing magnet.

In the case of chip-to-wafer bonding particularly, all chips can be placed on the wafer with loose alignment accuracy with high throughput. The force between pairing magnet will push for the high precision alignment via self-alignment process. At some cases, high-precision alignment can be done between the chips and the wafer at the same time via external activation of self-alignment between the patterned magnets by external magnetic field. Thus a high-precision alignment method with high UPH is achieved. Since the magnetic force will hold the alignment together between the chip and the wafer, the bonding can be done at once for all the chips after the chips have all been aligned. By doing so, we can also cut down the UPH time for chip-to-wafer bonding.

A few patterned magnet structures and materials are proposed: 1) patterned high moment ferromagnetic magnets such as pillar or bar; 2) patterned soft magnetic magnets over hard perpendicular magnetic under-layer with large coercivity; 3) patterned magnets made of high moment ferromagnetic-non-magnetic-ferromagnetic sandwich or multilayer structures. 4) Specially design structure with patterned ferromagnetic magnets built into the copper (Cu) via connection for very fine self-alignment for high density electrical via structures.

Since the principle of our proposed scheme and structures is based on the magnet pairing, the closer the magnet is brought together, the better the alignment and the stronger the force between the magnet pairs. The alignment accuracy is determined by the size of the patterned magnet pair and photolithography alignment accuracy as well as the process accuracy available for fabricating the patterned magnet pairs. All these wafer level process accuracy is well below micron meter scale depending on the technology used. At extremely case, it can be well below 50 nm. As such, our proposal provides theoretical alignment accuracy well below current capability of the wafer-to-wafer and chip-to-wafer bonding.

Our proposal also provides a general alignment method which can be extended into a wider implementation.

BRIEF DESCRIPTION OF THE DRAWINGS

FIG. 2A illustrates the cross section view of one of the embodiments of adjacent two proposed patterned magnets built near the bonding interface, which are used to assist alignment.

FIG. 2B illustrates the cross section view of one of the embodiments of adjacent two proposed patterned magnets built near the bonding interface, which are used to assist alignment.

FIG. 4A shows the cross section view of one of the embodiment of nearby four proposed patterned soft magnets built over perpendicular hard magnetic under-layer built near the bonding interface, which are used to assist alignment.

FIG. 4B shows the projected magnet view of FIG. 4A.

DETAILED DESCRIPTION

Figure 1:
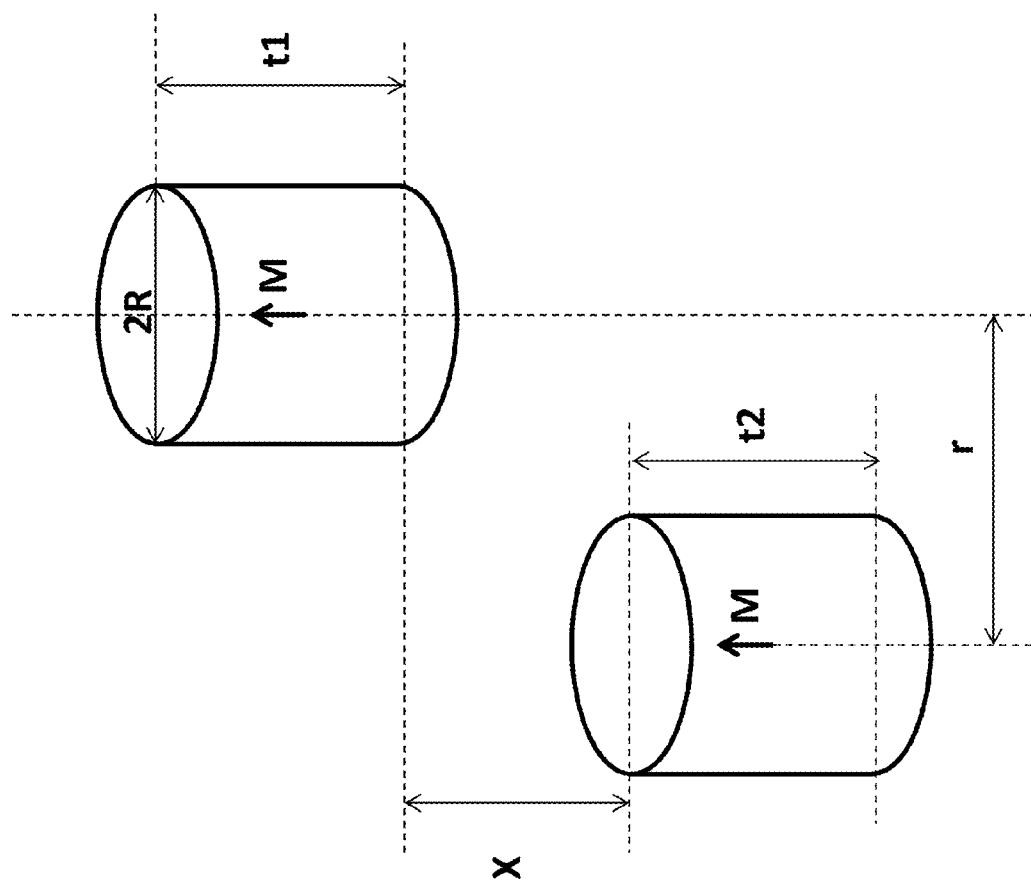
FIG. 1. A scheme of two interaction cylinder magnets with parallel but displace axes. For simplicity, the two cylinder magnets have uniform magnetization M, which does not change in the presence of the other magnet.

The present invention relates to the alignment scheme and maintains the alignment during wafer-to-wafer and chip-to-wafer bonding. In order to take the advantage of self-alignment and attractive force between the magnetic north pole (N-pole) and south pole (S-pole), specially designed magnets, which can be brought together for pairing (or matching), are fabricated via wafer level processes. The magnetic force will bring the magnet pair together and align them automatically to minimize the system energy. Using this approach, the alignment accuracy can be greatly improved well beyond the current capability and its ultimate limits lay on the wafer level process capability.

In details, four kinds of the structures of patterned magnets have been proposed, namely, patterned continue magnetic layer; patterned magnetic sandwich or multilayer; electrical via with built-in magnets; and patterned soft magnets over perpendicular hard magnetic layer. For each kind of the patterned magnets, external magnetic field can be used before wafer bonding to set up the magnetization configuration with in patterned magnet. The external field can also be tuned with predetermined variation, during wafer bonding or chip-to-wafer bonding, to control the degree of magnetization alignment and therefore manipulate the force between the patterned magnets. For assisting the wafer bonding alignment, predetermined arrangement of the patterned magnets can be made on one component (for example a wafer) while its complimentary arrangement of the pairing patterned magnets are fabricated on the other component (wafer or chip(s)). Once the magnetization of the patterned magnets is aligned to the predetermined setting, while the two components are brought to close proximity, the force between the pairing magnets will automatically align the two components in order to minimize the overall magnetic energy. On some of our proposed patterned magnets, the magnetic flux can be set to near zero once the bonding is finished to minimize the impact of add-on patterned magnets on device performance.

Our proposal has its unique merits comparing to existing arts in the field, they are:
1) Self-alignment with capability for sub-micron dynamic accuracy—as the wafers are approaching closer during wafer bonding, the magnetic force is getting bigger and force the pairing patterned magnets aligned.
2) Sub-micron accuracy—the patterned magnets used to facilitate the self-alignment are made from wafer level processes, which are well capable for sub-micron pattern definition.
3) Fast alignment for bonding (high UPH)—after a very coarse/loose alignment is done, the two wafers can be brought together very quickly without worries of alignment drifting off during wafer approaching. In case of chip-to-wafer bonding, all chips can be placed on the wafer with loose alignment accuracy with high throughput. Then high-precision alignment can be done between the chips and the wafer in the same time via external activation of self-alignment between patterned magnets by external magnetic field. Thus a high-precision alignment method with high UPH is achieved.
4) External field manipulate-able and controllable—the force between the pairing magnets is decided by the alignment degree of magnetization (saturated or not), which can be tuned by external magnetic field. In our proposed case, the self-alignment can be activated when needed. For example, in the case of chip-to-wafer bonding.
5) Capable of solid contact between the patterned magnets under magnetic force at bonding interface—avoid wafer drafting during bonding due to the formation of liquid phase.

The following description is provided in the context of particular designs, applications and the details, to enable any person skilled in the art to make and use the invention. However, for those skilled in the art, it is apparent that various modifications to the embodiments shown can be practiced with the generic principles defined here, and without departing the spirit and scope of this invention. Thus, the present invention is not intended to be limited to the embodiments shown, but is to be accorded the widest scope consistent with the principles, features and teachings disclosed here.

With reference of the FIG. 1 showing two cylinder magnets with parallel but displace axes. For simplicity, the two cylinder magnets have uniform magnetization M, which does not rotate in the presence of the other magnets. In order to illustrate more clearly the dominated factors and give a rough estimation of the force between these two magnets, we take a simplified form of equation of the force below in the reference [J. Magn. Magn. Mater., 321 (2009) 3758-3763].

$$F_z \approx -\frac{1}{2}\pi K_d R^4 \sum_{i,j=0}^{1} \frac{(-1)^{i+j}}{(x+it1+jt2)^2}\left[1 - \frac{3}{2}\frac{r^2}{(x+it1+jt2)^2}\right] \quad \text{(equation 1)}$$

Where 2R is the diameter of the cylinder; t1 and t2 are the thickness of the cylinder, x is the vertical distance between the adjacent surfaces of the magnets; r is the lateral distance between the two axes of the magnets; the magnetostatic energy constant $K_d = \mu_0 M^2/2$; M is the saturation magnetization of the magnet and $\mu_0$ is the vacuum permeability.

If we assume the thickness t1=t2=0.5x=0.5r (x=r in this case), we can further simplify the equation 1 to:

$$F_z \approx -\frac{1}{2}\pi K_d R^4 \left(\frac{0.639}{x^2}\right) \approx -\frac{1}{2}\pi(\mu_0 M^2/2)R^4\left(\frac{0.639}{x^2}\right) \quad \text{(equation 2)}$$

If we look deeply into the equation 1 and equation 2, we can learn the following about the force between two magnets:
i) Saturation magnetization has a square relation with force. The higher the moment, the larger the force;
ii) The area facing towards each other, which is represented by $R^2$, has one of the biggest impact on force while the thickness has less impact.
iii) The vertical distance x between magnet has much bigger impact the lateral distance r (reference equation 1).

The above conclusions are used to guide our design of the magnet to give better performance for wafer alignment purpose.

Based on the equation 2, we can make estimation of force between two cylindrical magnets with R=1 um, t=5 um and saturation moment M=2.0 T, which is separated vertically and laterally 10 um, is equal to $1.596 \times 10^{-8}$ (N). A standard 200 mm Si wafer with 0.5 mm thickness weights 0.040 Kg. To lift such a wafer using the magnet pairs above with similar separations (10 um laterally and vertically), we need roughly $2.5 \times 10^7$ pairs. This implies that distance between adjacent magnet pairs is only 40 um. As the vertical distance x is reduced, the force Fz increases quickly. If we would like to increase the separation between adjacent magnet pairs, which means to lower the magnet-pair density, the most efficiency way is to increase the surface area of the magnet facing to each other.

In the following context, we will follow two different approaches to design our pairing patterned magnets: case 1 (FIG. 2-FIG. 3) uses dense pairing patterned magnets, which implies the patterned magnets not only occupy the dicing area but also some of the device areas; the case 2 (FIG. 4) will use the dicing areas or edge areas mostly but with patterned magnets having big surface area facing to each other. For the case 1, if the device is sensitive to magnetic field, we need to design patterned magnets in such a way that the magnetic flux leakage from the pairing patterned magnets can be set to close to zero after bonding.

(let us list the materials first, then give the example how they works followed by example in wafer bonding)

FIG. 2A illustrates the cross section view of one of the embodiments 2100 of adjacent two proposed patterned magnets used to assist alignment. The patterned magnets 2103 is surrounded by matrix 2101 made of either adhesive or oxide or other dielectric or semiconductor materials. At the interface between the magnet and surrounding matrix, an optional passivation layer 2102 such as TiN or $SiO_2$ or $Si_3N_4$ can be used to avoid metal diffusion. The magnets are made of ferromagnetic materials such as CoFe, CoNiFe, NiFe, CoPt, CoCr, CoCrPt etc or their combinations. The white arrows represent the magnetization directions in the magnets. The patterned magnet 2103 is adjacent to another patterned magnetic 2104, which has identical structure as 2103. The distance or gap 2105 between patterned magnet 2103 and its adjacent magnets (in this case, magnet 2104) should be larger enough to avoid the misalignment due to lateral offset after coarse alignment is implemented. In other words, the distance or gap 2105 between adjacent magnets is so large that there will be no mistaken offset once the coarse alignment is performed and impact of magnetic force takes effects.

FIG. 2B illustrates the cross section view of one of the embodiments 2200 of adjacent two proposed patterned magnets used to assist the alignment. The patterned magnet 2206 are made of patterned multilayer or tri-layer layer compromising alternating ferromagnetic layer and non-magnetic layer. In this particularly case, for simplicity of drawing, the patterned magnet 2206 are made of patterned tri-layer consisting of ferromagnetic layers 2203 and 2204 separated by a non-magnetic layer 2205. The magnets are made of ferromagnetic materials such as CoFe, CoNiFe, NiFe, CoPt, CoCr, CoCrPt etc with in-plane anisotropy. The white arrows represent the magnetization directions in the magnets. Due to the magnetic static coupling between the 2203 and 2204, the magnetization directions of the 2203 and 2204 points to opposite direction. The magnet 2206 is surrounded by matrix 2201 made of either adhesive or oxide or other dielectric or semiconductor materials. At the interface between the magnet and surrounding matrix, an optional passivation layer 2202 such as TiN or $SiO_2$ or $Si_3N_4$ can be used to avoid metal diffusion. The distance or gap 2208 between patterned magnet 2206 and its adjacent magnets (in this case, magnet 2207) should be larger enough to avoid the misalignment due to lateral offset after coarse alignment is implemented. In other words, the distance or gap 2208 between adjacent magnets is so large that there will be no mistaken offset once the coarse alignment is performed and impact of magnetic force takes effects.

Figure 3A:
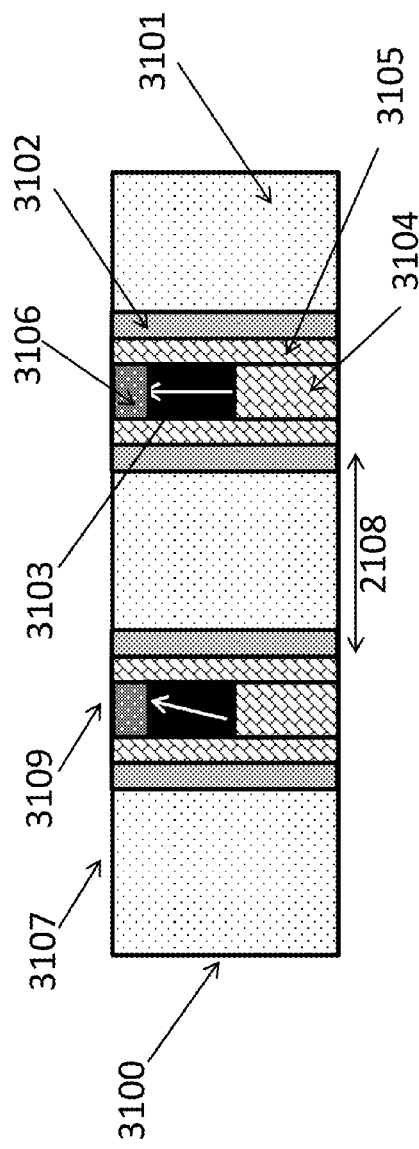
FIG. 3A illustrates the cross section view of one of the embodiments of adjacent two proposed patterned magnets used to assist the alignment, which also act as electric connection.

FIG. 3A illustrates the cross section view of one of the embodiments 3100 of adjacent two proposed patterned magnets used to assist the alignment, which also act as electric connection. In other words, they are electrical connection via with built-in magnets for the alignment and local pressing force enhancement during bonding. The bonding surface 3107 in this case is the top surface in the drawing. All electrical via are surrounded by matrix 3101 made of either adhesive or oxide or other dielectric or semiconductor materials. At the interface between via and matrix 3101 can have an optional passivation layer 3102. All electrical via have detailed structures: the highly conductive portion 3104 made of materials such as Cu, Al or Au; the built-in magnet 3103 made of ferromagnetic materials such as CoFe, CoNiFe, NiFe, CoPt, CoCr, CoCrPt etc; The bonding interface layer(s) 3106 made of either metal (Cu, Al, Au) or Eutectic or solder depending on choice of the bonding approaches; an optical highly conductive sidewall enhancement layer 3105 made of Cu or Au or Al. The structure can be made by wafer level processes such as photolithography, physical vapor deposition, electrodeposition and CVD metal deposition, reactive ion etch or ion milling. The white arrows drawn in the magnet 3103 represents the magnetization, whose direction depends on the aspect ratio (shape anisotropy) of magnet when there is no external magnetic field exists. The distance or gap 3108 between patterned magnet 3106 and its adjacent magnets (in this case, magnet 3109) should be larger enough to avoid the misalignment due to lateral offset after coarse alignment is implemented. In other words, the distance or gap 3106 between adjacent magnets is so large that there will be no mistaken offset once the coarse alignment is performed and impact of magnetic force takes effects.

Figure 3B:
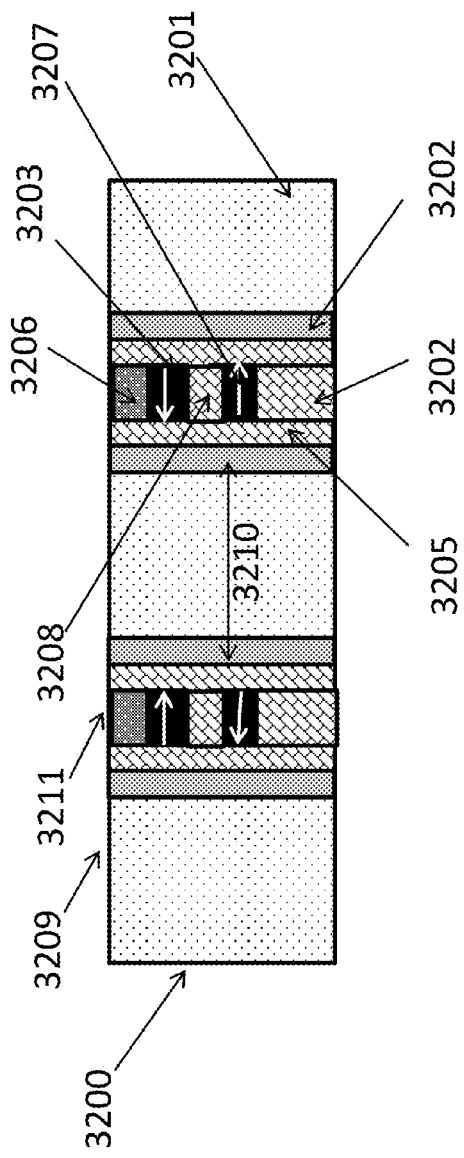
FIG. 3B illustrates the cross section view of one of the embodiments of adjacent two proposed patterned magnets used to assist the alignment, which also act as electric connection.

FIG. 3B illustrates the cross section view of one of the embodiments 3200 of adjacent two proposed patterned magnets used to assist the alignment, which also act as electric connection. In other words, they are electric connection via with built-in magnets for the alignment and local pressing force enhancement during bonding. The bonding surface 3209 in this case is the top surface in the drawing. All via are surrounded by matrix 3201 made of either adhesive or oxide or other dielectric or semiconductor materials. At the interface between via and matrix 3201 can have an optional passivation layer 3202. All vias have detailed structures: the highly conductive portion 3202 made of materials such as Cu, Al or Au; the built-in magnet having a trilayer structure (or multilayer or made of alternating ferromagnetic layer and non-magnetic layer, For simplicity, we use trilayer here to illustrate our points), which is made of a highly conductive layer 3208 (Cu, Al or Au) sandwiched between two layers of ferromagnetic layers 3203 and 3207 made of in-plane ferromagnetic materials such as CoFe, CoNiFe, NiFe, CoPt, CoCr, CoCrPt etc; the bonding interface layer(s) 3206 made of either metal (Cu, Al, Au) or Eutectic or solder depending on choice of the bonding approaches; an optical highly conductive sidewall enhancement layer 3205 made of Cu or Au or Al. The structure can be made by wafer level processes such as photolithography, physical vapor deposition, electrodeposition and CVD metal deposition, reactive ion etch or ion milling. The white arrows drawn in the magnetic layers 3203 and 3207 represent the magnetization. The magnetizations of 3203 and 3207 within one via lay in plane and pointing to opposed direction so that the overall magnetic flux extending outside the via is zero or close to zero when there is no external magnetic field exists. The distance or gap 3210 between patterned magnet 3206 and its adjacent magnets (in this case, magnet 3211) should be larger enough to avoid the misalignment due to lateral offset after coarse alignment is implemented. In other words, the distance or gap 3206 between adjacent magnets is so large that there will be no mistaken offset once the coarse alignment is performed and impact of magnetic force takes effects.

FIG. 4A shows the cross section view of one of the embodiment 4100 of nearby four proposed patterned soft magnets built over perpendicular hard magnetic under-layer used to assist alignment. The embodiment 4100 comprises patterned soft patterned magnets similar to magnetic pillar or bar 4103 with thickness 4106 fabricated over hard magnetic underlayer 4104 with perpendicular magnetic anisotropy. The thickness of hard magnetic under-layer 4104 is 4107. Soft magnets similar to 4103 are surrounded by matrix 4101 made of either adhesive or oxide or other dielectric or semiconductor material. An optional passivation layer 4102 can be used to separate the soft magnets like 4103 from the matrix 4101. The soft magnet such as 4103 can be made of soft magnetic materials such as Co, Fe, CoFe, CoNi, FeCo, CoNiFe, NiFe or other soft magnetic alloy comprising Co, Fe, Ni. The hard magnetic under-layer 4104 can be made of CoCr, CoCrPt, TbFeCo, FePt, Fe/Pt multilayer or any CoCr-based or FePt-base magnetic layer similar to those used as perpendicular magnetic medium on hard disk drive. The magnetic layer 4104 and magnet like 4103 could have some seed layer for magnetic properties control and capping layer for protection. The vertical coercivity (Hc) of the soft magnets similar to 4103 is significant smaller than the coercivity of the hard magnetic under-layer 4104 with perpendicular anisotropy so that the external field can be used to independently control the magnetization direction of soft magnets similar to 4103 and hard magnetic underlayer 4104. For example, a large field can be applied to alignment all the magnetization in both soft magnets like 4103 and hard magnetic underlayer 4104 toward one direction (in case in FIG. 4A, magnetization all points down ↓). Then a small reverse field larger than the coercivity of soft magnets similar to 4103 is applied to align the magnetization of soft magnet 4103 to up-direction ↑. The point up arrow (↑) 4105 represents the magnetization orientation in soft magnet, while the point down arrow (↓) 4108 illustrates the magnetization orientation in magnetic hard under layer. Whenever it is necessary, while maintaining the complimentary patterns of the magnets on the two bonding wafers (shown in FIG. 4B below), the respective coercivity (Hc) for the patterned soft magnet similar to 4103 and hard underlayer 4104 on the two bonding wafers can be deliberately tuned to separate apart so that the external magnetic field can be used to switch one kind of magnets or magnets with lower coercivity without affecting the rest. The tuning of the coercivity Hc can be done via choice of material, seed layer and thickness for both soft magnets similar to 4103 and hard magnetic underlayer 4104. The distance or gap between any adjacent patterned magnets should be larger enough to avoid the misalignment due to lateral offset after coarse alignment is implemented. In other words, the distance or gap between any adjacent magnets is so large that there will be no mistaken offset once the coarse alignment is performed and impact of magnetic force takes effects.

FIG. 4B shows the projected magnet view of FIG. 4A. The projected magnetization orientation of each portion is illustrated by the point up (•) or point down (⊗) arrow. If we look into the projected magnetic pattern, it looks like commercial bar code we normally see on the commercial product. For convenience, we can call this kind projected magnetic pattern as wafer level magnetic bar code. The soft magnet width 4201 along the "bar code" and the gap 4202 between soft magnet as well as the arrangement of the pattern itself can be generated by commercial available programs or software. Although only one dimensional wafer level magnetic "bar code", the same principle can be used to generate cross wafer or local two dimensional bar code to satisfy in-plane alignment control in two orthogonal directions. The key point is that the pattern will be unique on one of the bonding wafers while the complimentary unique patterns on the other. When the two wafers approach together, the complimentary pattern and its components will be aligned automatically to each other. A optimized wafer level magnetic bar code can be generated by balancing the gap 4202, the width 4201, the width of the "bar code" 4203, the thickness of soft magnet 4106 and thickness of hard magnetic underlayer 4107 (shown in FIG. 9) so that the magnetic force either attractive force or expulsive force to ensure the unique pattern will be matched automatically.

In the following context, examples are given to illustrate how the attractive force between dissimilar magnetic poles of patterned magnets and the expulsive force between similar magnetic poles of patterned magnets facilitate the self-alignment between the pairing patterned magnets and ultimately assist alignment during wafer-to-wafer and chip-to-wafer bonding.

Figures 5A, 5B:
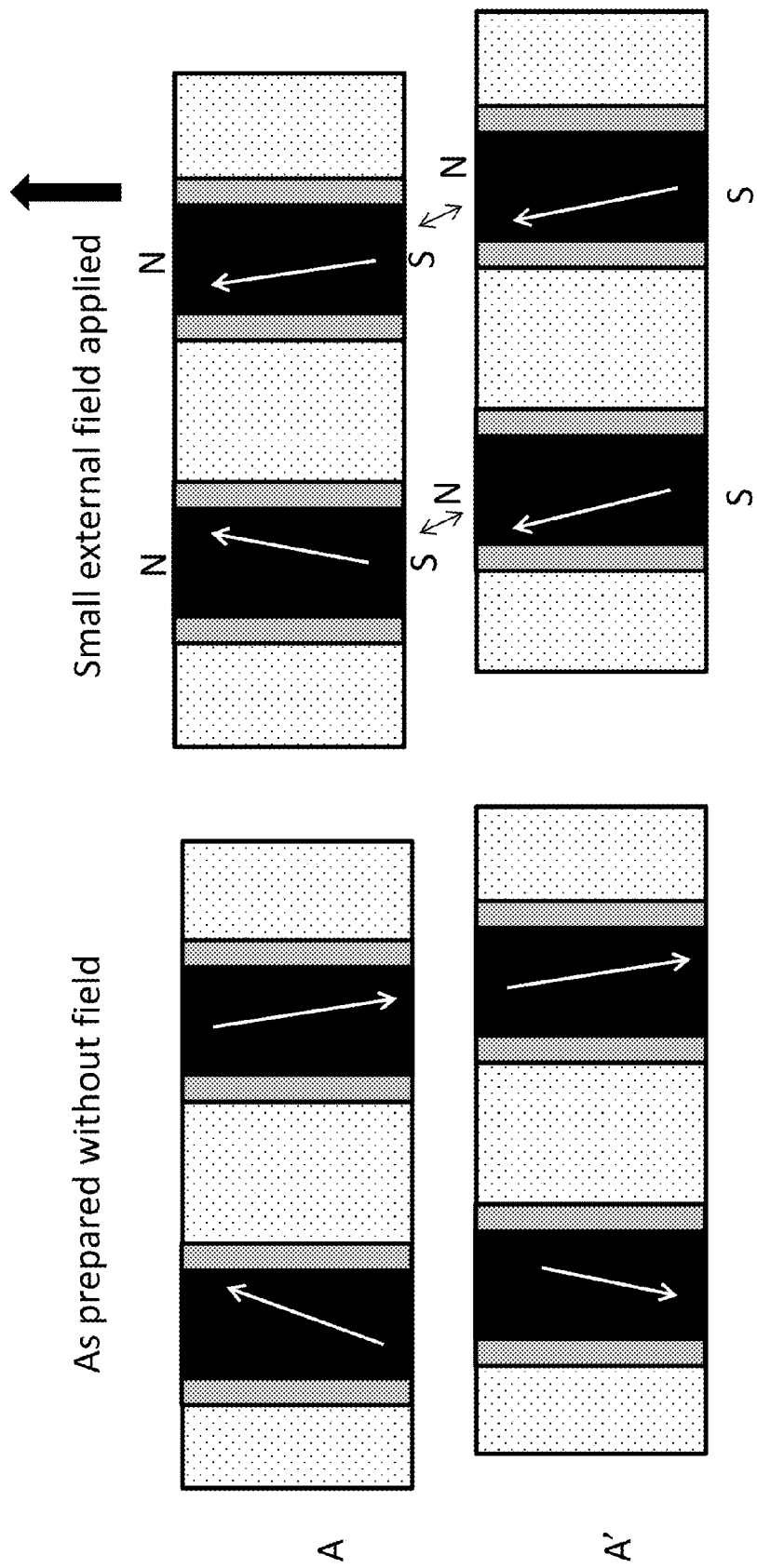
FIG. 5 (A-C) illustrates how the self-alignment principle works for the patterned magnet structured shown in FIG. 2A.
Figure 5C:
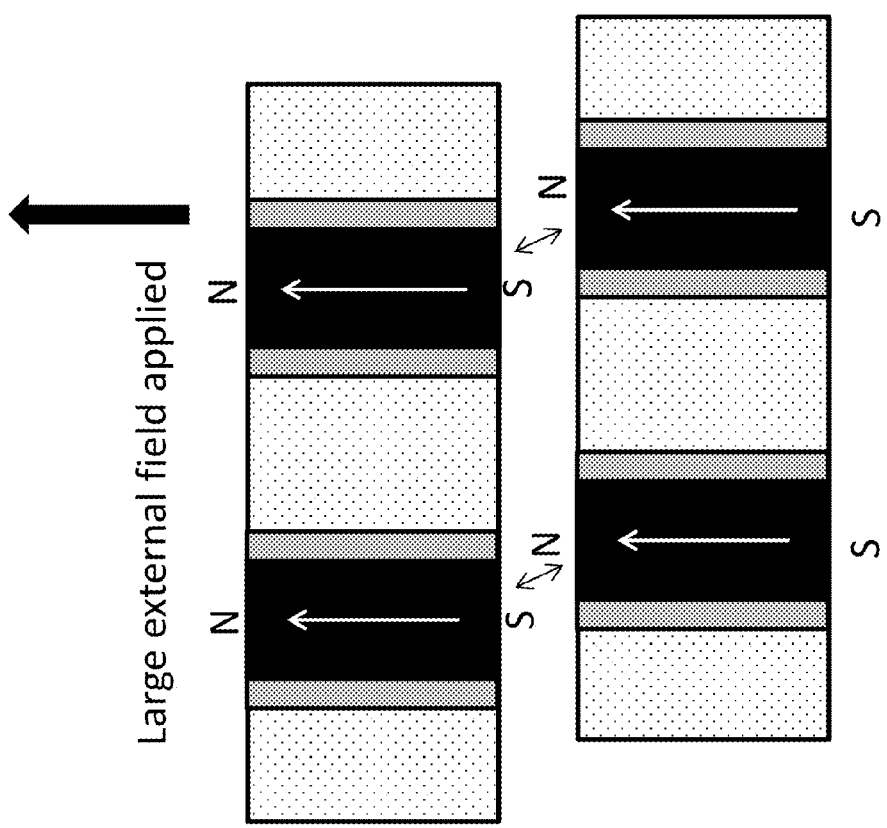

FIG. 5 (A-B) illustrates how the self-alignment principle works for the patterned magnet structured shown in FIG. 2A. FIG. 5A shows two components (wafer or chip) A and A' with patterned magnet pairs for alignment when there is no external magnetic field exists. The magnetization representing by the white arrows has a random orientation pending on the aspect ratio induced magnetic shape anisotropy of the patterned magnets. In this illustration, the length of the patterned magnet is larger than that lateral dimensions. As such, the magnetization prefers to close to the longer length direction but has a wider distribution. FIG. 5B shows the magnetization alignment under a small magnetic field applied. All the magnetizations in the patterned magnets are aligned somehow but not at perfect alignment status (or not saturated). This causes the magnet southern (S) and Northern (N) pole also re-aligned. When the two components (wafer or chip) are approaching together after coarse alignment to ensures no mistakenly overlapping of the adjacent magnet pairs due to large lateral shifting roughly equal to distance between the adjacent magnet pairs during wafer bonding or chip-to-wafer bonding, the magnetic force between the S and N pole for the in-paired magnets will force to align together in order to minimize the overall the magnetic energy. When the external magnetic field increases, the decree of the alignment or saturation of the magnetization of the patterned magnets also increases, which is directly proportional to the magnetic force between the patterned magnets. When a large enough external magnetic field is applied, all the magnetization will be aligned as shown in FIG. 5C (patterned magnets are saturated). This will increase the magnetic force to the maximum between the magnet southern (S) and Northern (N) poles comparing to the case in FIG. 5B. If the magnets are made of the hard magnet materials such as CoPt, CoCr or CoCrPt etc, after alignment, even the external magnetic field is turned off, the alignment will still maintain due to its high coercivity Hc. For the soft magnetic materials case, after external magnetic field turn off, after the two components (wafer or chip) are joined, the aspect ratio will increases (e.g. doubled), the shape anisotropy will more or less maintain the magnetization orientation after bonding. Of course, the external magnetic field can be presented to enhance the force until the two components are fully bonded. For electrical via with built-in magnet shown in FIG. 3A, similar principle shown above will assist component (wafer or chip) alignment during binding.

Figures 6A, 6B:
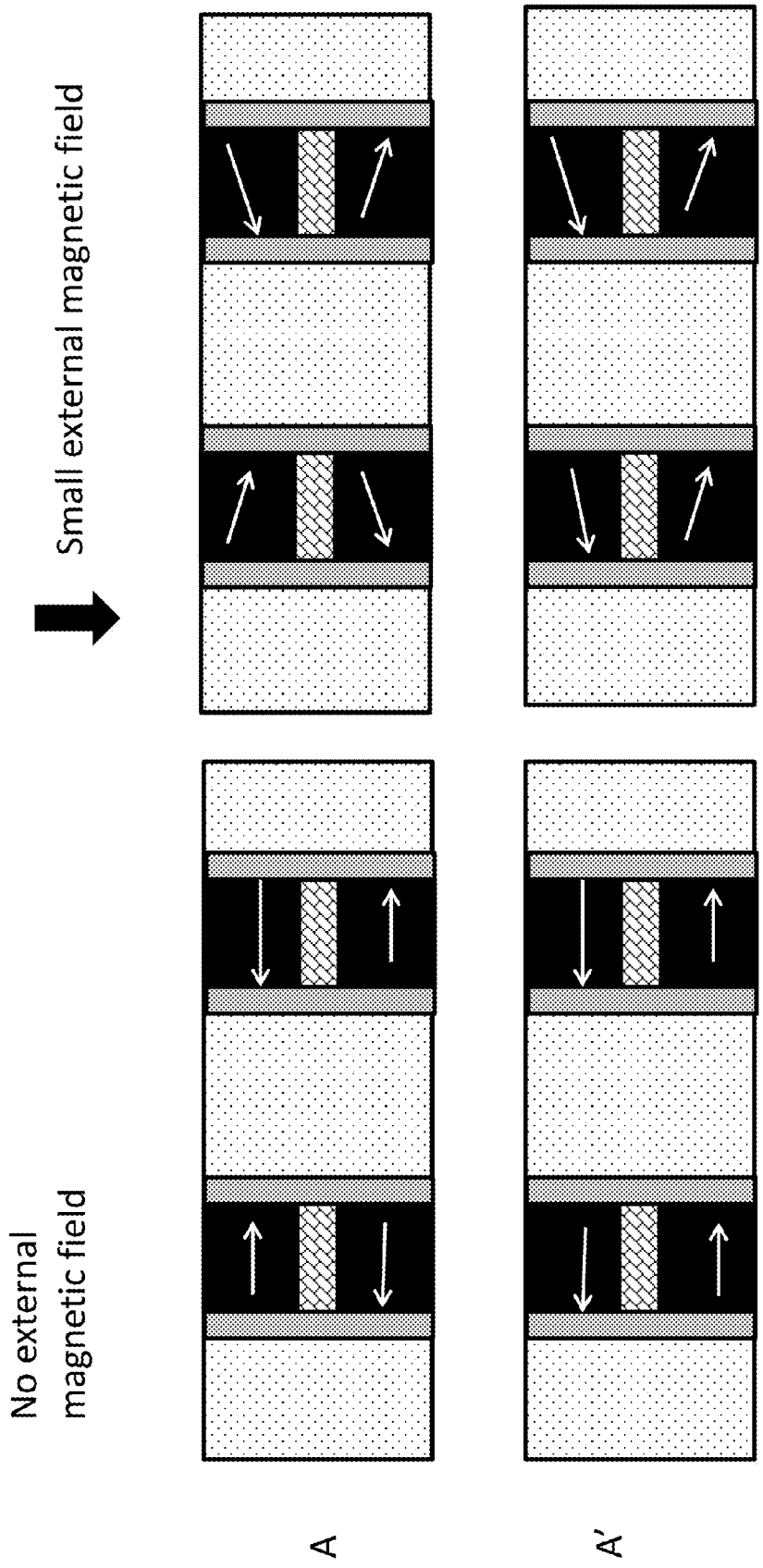
FIG. 6 (A-F) illustrates how the self-alignment principle works for the patterned magnet structure shown in FIG. 2B.

FIG. 6 (A-D) illustrates how the self-alignment principle works for the patterned magnet structured shown in FIG. 2B. FIG. 6A shows two components (wafer or chip) A and A' with patterned magnet pairs for alignment when there is no external magnetic field exists. The magnetization representing by the white arrows lays in-plane due to the nature of the in-plane magneto-anisotropy of the magnetic materials. Within each of the patterned magnet, the magnetizations of the two magnetic layers point to opposite to have an enclosed magnetic flux configuration so that there is little magnetic flux leaking out of the magnet. This has great advantages as the pattern magnets can be left on wafers or chips after bonding as it will have no impact on the device performance due to nature of zero-flux-leakage. As such, the pattern magnets for self-alignment can be arranged cross more areas on the bonding wafers or chips. FIG. 6B-FIG. 6D show the evaluation of magnetization configure when the applied external magnetic field gradually increased. When the external magnetic field is small, most component of the magnetization is more or less still keep in-plane although all the magnetization directions turn towards the applied field direction. When the two components (wafer or chip) approach together after coarse alignment to ensures no mistakenly overlapping of the adjacent magnet pairs due to large lateral shifting roughly equal to distance between the adjacent magnet pairs during bonding, the magnetic force between the magnet pairs for the self-alignment is small. As the field increases, more component of the magnetization will orients towards the field direction and make the attract force between the in-pair magnets gradually increase as well. Eventually all the magnetizations are aligned on the direction of the external magnetic field as long as the field is big enough as shown in FIG. 6D. The gradual increase of the attract force during bonding give a great freedom and time for the more detailed and fine alignment control and adjustment to give the best alignment result when the two wafers are approaching together during the process of bonding. FIG. 6E show the magnetization configure after bonding when the vertical magnetic field still is maintained till the whole bonding process is settled. FIG. 6F shows the final magnetization configuration after a large in plane magnetic field is applied to realign the magnetization of the magnets to in-plane direction followed by gradually reducing the in-plane to zero. In order to minimize the final magnetostatic energy, the final magnetization configure will reach such a status that the overall the flux leakage for a balance magnet pair is close to zero. This gives a great advantage because the built-in magnet could be fabricated close to the function devices without affecting its functions due to little magnetic flux leakage from the structures. The self-alignment principle shown above can equally applied for patterned magnet shown in FIG. 3B to assist the bonding process.

Figure 7A:
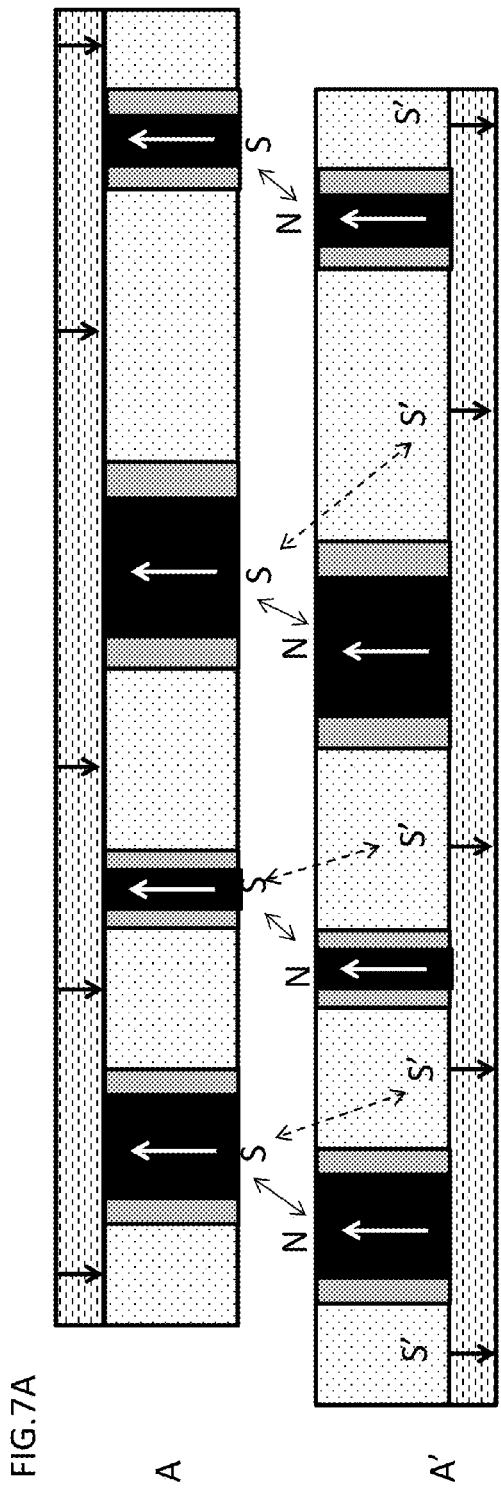
FIG. 7 (A-B) illustrates how the self-alignment principle works for the patterned magnet shown in FIG. 4.
Figure 7B:
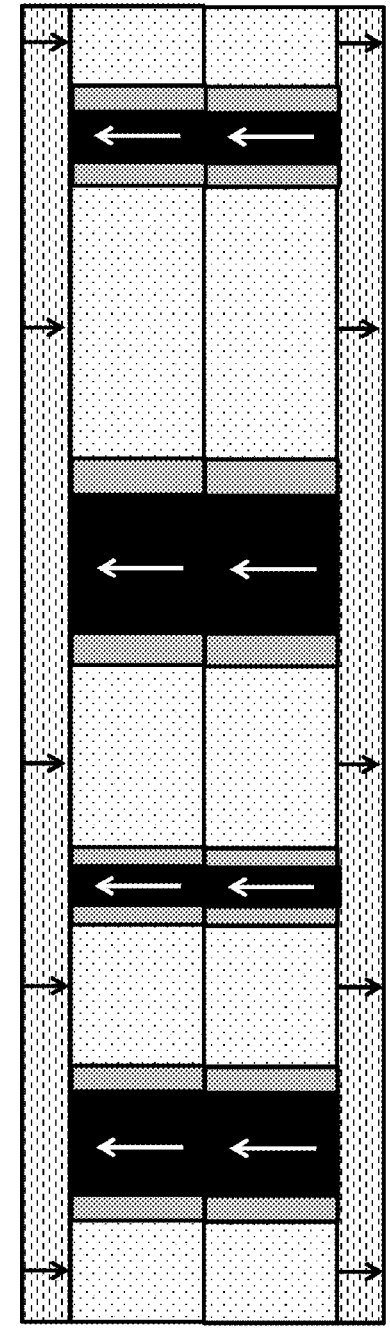

FIG. 7 (A-B) illustrates how the self-alignment principle works for the patterned magnet shown in FIG. 4. Before bonding, the magnetization of the patterned magnets on component A (wafer or chip) are aligned in the external field as shown while the magnetization of its complimentary magnets on component A' (wafer or chip) also aligned in the way shown in FIG. 7A. External magnetic field can be applied during alignment as well as bonding process to maintain the magnetization configurations as shown here. When the components (wafer and chip) are approaching together, the magnetic force between North pole (N) and Southern pole (S) in the soft magnets will pull them together (shown here is solid arrows) while there is a expulsive force (shown here in dotted arrows) between southern pole (S) of soft magnet and southern pole (S') for the hard magnetic under-layer. The expulsive force will pull the wafer away and reduce the friction force during lateral alignment adjustment till the self-alignment force a near perfect matching/pairing to give the minima energy to the whole system as shown in FIG. 7B.

Figure 8:
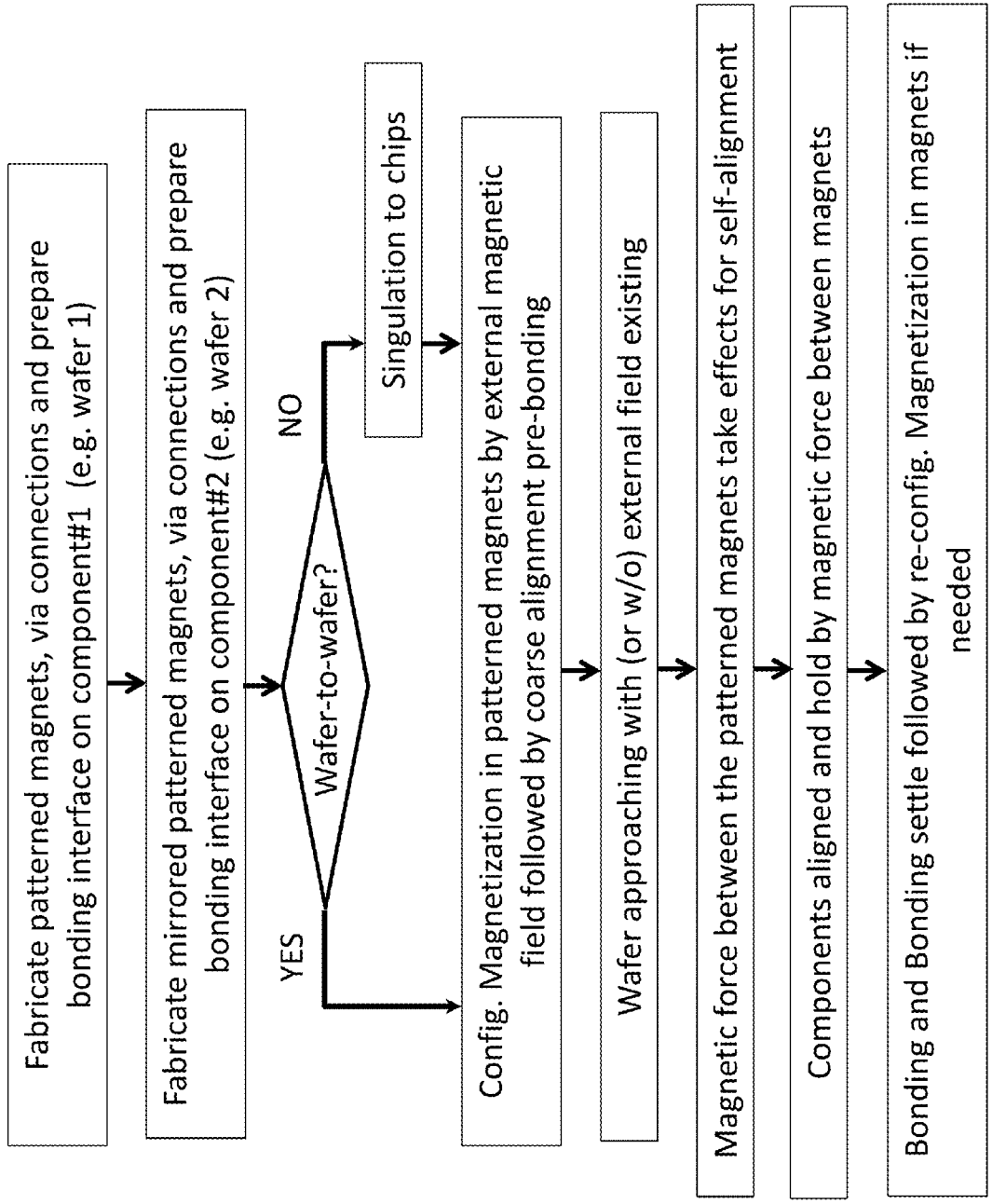
FIG. 8 illustrates an example of flow chart on how to use the magnets proposed above to assist alignment during two component (wafer or chip) bonding.

FIG. 8 illustrates an example of flow chart on how to use the magnets proposed above to assist alignment during two component (wafer or chip) bonding.

Figure 9:
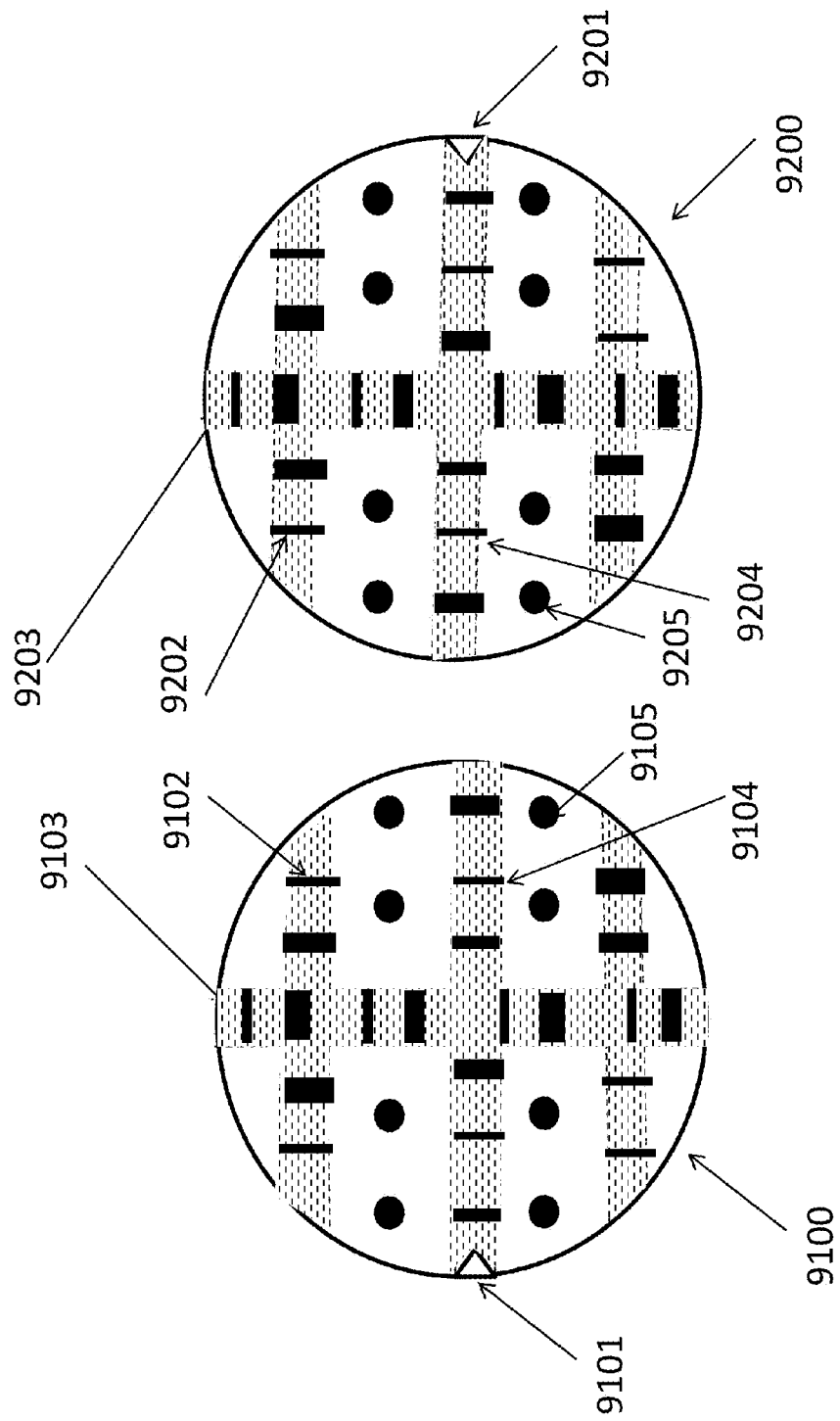
FIG. 9 illustrates implement of patterned magnets shown in FIG. 4A and FIG. 4B on two on wafers to assist alignment for bonding

FIG. 9 illustrates implement of patterned magnets shown in FIG. 4A and FIG. 4B on two on wafers to assist alignment for bonding. The patterned magnets and their mirrored magnets, which are arranged in this particular example similar to commercial bar-code at two orthogonal directions, are fabricated using wafer level processes. Shown here FIG. 9, they are arranged within two kinds of orthogonal wafer dicing lines. However, it is unnecessary that the wafer level magnetic bar code stripes locate only within the wafer dicing line. They can be arranged in the wafer edge areas or areas without devices or even within the die at the location, which is far away from the critical devices so that the magnetic flux leaked from the bar code strips will not affect the performance of the devices. The magnetization configurations of patterned magnets and their mirrored magnet are set by predetermined variable external magnetic field. In the shown case in FIG. 9, wafer 9100 with wafer notch 9101 has some wafer level magnets arranged in pattern similar to commercial bar code stripes 9103 and 9102 built near and on bonding interface along the orthogonal wafer dicing lines. For the simplicity reason, we can call them wafer level magnetic bar code stripes. Wafer 9100 also has some electrical connections 9105 within the die, which needs to connect to its counterpart connections 9205 on wafer 9200, which also have wafer notch 9201. On wafer 9200, there are mirrored patterned magnets arranged to a complimentary strip pattern (or wafer level magnetic bar code stripes) 9203 and 9202 build at correspondent locations to match their own counterparts 9103 and 9102 on wafer 9100. Between the complimentary stripes, all its components will match to each other, for example, the soft magnet 9104 matches its counterpart 9204. During the wafer bonding, the two notches 9101 and 9201 will be coarsely aligned and a predetermined variable external magnetic field is applied to set up the magnetization direction for their components to meet predetermined requirements. When the two wafers are brought together, the magnetic force between the patterned magnets and it counterparts will force each individual patterned magnet to match its unique counterpart, therefore automatically align the two bonding wafers. The magnetic force will press and hold the two wafers together during bonding when the distance between the two wafers is reduced.

What is claimed is:

1. A method for aligning two components and maintaining alignment during bonding, comprising the steps of:
    a. fabricating single or plural arrays of patterned magnets forming a predetermined arrangement as well as electrical connections using wafer level processes at or near a bonding interface on a first component;
    b. fabricating single or plural arrays of mirrored patterned magnets forming a complementary arrangement matching said arrangement on said first component along with complementary electrical connections using wafer level processes at or near a bonding interface on a second component;
    c. doing a coarse alignment by matching said arrangement of said patterned magnets on said first component to said complementary arrangement of said patterned magnets on said second component after positioning said bonding interface on said first component facing to said bonding interface on said second component;
    d. applying a direction-predetermined external magnetic field with preset variation of the field strength to align magnetizations of said magnets on both said first component and said second component to ensure the complimentary north-pole facing south-pole for said magnets on said first component matching said mirrored magnets on said second component;
    e. keeping the said external magnetic field present while approaching said first component towards said second component, while the attractive or expulsive magnetic force between said magnet on said first component and said its said mirrored magnet on said second component forces the pair aligned together to facilitate wafer-to-component alignment between said first component and said second component;
    f. bonding said first component and said second component after aligning said components in close contact.

2. The method of claim 1, wherein said patterned magnets of step a and said mirrored patterned magnets of step b comprise patterned magnetic films separated by a non-magnetic matrix, while the distance between the adjacent magnets is large enough so that said coarse alignment of step c is sufficient to avoid misalignments of said magnet on said first component to the adjacent magnet of its said mirrored patterned magnet on said second component.

3. The method of claim 2, wherein said patterned magnetic films are made from high moment soft magnet materials.

4. The method of claim 2, wherein said patterned magnetic films are made of hard magnetic materials.

5. The method of claim 1, wherein said patterned magnets and said mirrored patterned magnets are made of a sandwich or multilayer structure comprising non-ferromagnetic material sandwiched between two ferromagnetic materials with in-plane magnetic anisotropy, so that the leaked magnetic flux of said magnets is close to zero at absence of magnetic field.

6. The method of claim 1, wherein said electrical connections of step a and said complimentary electrical connections of step b are made of high conductive materials.

7. The method of claim 1, wherein said electrical connections of step a and said complimentary electrical connections of step b have embedded magnets close to the bonding interface.

8. The method of claim 6 or claim 7, wherein said solder layer is made of metal multilayers forming an eutectic alloy of Al—Ge, Au—Ge, Au—In, Au—Si, Au—Sn, Cu—Sn, or lead contained solder.

9. The method of claim 7, wherein said embedded magnets are made from a ferromagnetic continuous block of materials containing Co, Fe or Ni with ferromagnetic coupling between the adjacent atoms continually.

10. The method of claim 7, wherein said embedded magnets are made from a sandwich trilayer or multilayer structure comprising non-ferromagnetic material sandwiched between two ferromagnetic materials with in-plane magnetic anisotropy, whose leaked magnetic flux is close to zero at the absence of magnetic field.

11. The method of claim 5 or claim 10, wherein the magnetization of said magnets is controllable using a pre-determined in-plane magnetic field to ensure the leaked flux is close to zero.

12. The method of claim 1, wherein said patterned magnets of step a and said mirrored patterned magnets of set b are made of patterned soft magnets fabricated over a hard magnetic underlayer with perpendicular magnetic anisotropy.

13. The method of claim 12, wherein the vertical coercivity of said soft magnets and said hard magnetic underlayer are significantly different so that the external field in step d can selectively switch said magnetic soft magnets without impacting others.

14. The method of claim 12, wherein the projected magnetic view of up-pointing and down-pointing magnetization of the magnets have predetermined arrangements on said first component and said second component when said components are wafers.

15. The method of claim 12, wherein said patterned soft magnets are made from high moment soft magnetic materials.

16. The method of claim 12, wherein said hard magnetic underlayer with perpendicular magnetic anisotropy is made of CoPt, CoCrPt, CoCr, Co, FePt, or CoPt/Pt, FePt/Pt multilayer and their combination.

17. The method of claim 1, wherein said external magnetic field of step d is set to zero after bonding is settled.

18. The method of claim 1, wherein said first component and said second component are one of a semiconductor, ceramic, dielectric, optical, or organic wafer, a chip comprising a chip over a substrate, an over-substrate device layer comprising a functional semiconductor, optical, nano- or micro-electrical-mechanical system, piezoelectric, ferroelectric, memory, biosensor, organic or fluidic device, an on-chip interconnection layer over a device layer, and a bonding interfacial layer.

19. The method of claim 1, wherein said first component or said second component are an interposer wafer made of silicon, ceramic, glass or plastic.

* * * * *